United States Patent
Hamada et al.

(10) Patent No.: US 10,304,939 B2
(45) Date of Patent: May 28, 2019

(54) SIC SEMICONDUCTOR DEVICE HAVING PN JUNCTION INTERFACE AND METHOD FOR MANUFACTURING THE SIC SEMICONDUCTOR DEVICE

(71) Applicant: Mitsubishi Electric Corporation, Chiyoda-ku (JP)

(72) Inventors: Kenji Hamada, Tokyo (JP); Masayuki Imaizumi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 75 days.

(21) Appl. No.: 15/030,763

(22) PCT Filed: Sep. 2, 2014

(86) PCT No.: PCT/JP2014/073058
§ 371 (c)(1),
(2) Date: Apr. 20, 2016

(87) PCT Pub. No.: WO2015/072210
PCT Pub. Date: May 21, 2015

(65) Prior Publication Data
US 2016/0247894 A1    Aug. 25, 2016

(30) Foreign Application Priority Data
Nov. 13, 2013    (JP) .................................. 2013-234581

(51) Int. Cl.
*H01L 21/04*    (2006.01)
*H01L 29/06*    (2006.01)
(Continued)

(52) U.S. Cl.
CPC ........ *H01L 29/6606* (2013.01); *H01L 21/046* (2013.01); *H01L 21/322* (2013.01);
(Continued)

(58) Field of Classification Search
CPC ............. H01L 29/6606; H01L 29/1095; H01L 29/0878; H01L 29/861; H01L 29/32;
(Continued)

(56) References Cited

U.S. PATENT DOCUMENTS 6,133,120 A * 10/2000 Miyajima ............... C30B 25/00
257/E21.056
6,703,294 B1 * 3/2004 Schoner .................. C30B 31/22
257/E21.057
(Continued)

FOREIGN PATENT DOCUMENTS

| JP | 11-274487 A | 10/1999 |
|----|-------------|---------|
| JP | 2001-94098 A | 4/2001 |

(Continued)

OTHER PUBLICATIONS

J. Zhang, et al., "Electrically active defects in n-type 4H-silicon carbide grown in a vertical hot-wall reactor", Journal of Applied Physics, vol. 93, No. 8, Total 8 Pages, (2003).

(Continued)

*Primary Examiner* — Mohsen Ahmadi
*Assistant Examiner* — Scott E Bauman
(74) *Attorney, Agent, or Firm* — Oblon, McClelland, Maier & Neustadt, L.L.P.

(57) ABSTRACT

A method for manufacturing a semiconductor device capable of reducing an ON resistance. In the present invention, a drift layer is formed on a substrate. An ion implanted layer is formed in a surface of the drift layer. A surplus carbon region is formed in the drift layer. The drift layer is heated. In a case where the surplus carbon region is formed, the surplus carbon region is formed in a region deeper than an interface between the ion implanted layer and the drift layer. In a case where the drift layer is heated, impurity ions of the ion implanted layer are activated to form an activation (Continued)

layer, and interstitial carbon atoms are dispersed toward the activation layer.

2 Claims, 9 Drawing Sheets

(51) Int. Cl.
| | |
|---|---|
| *H01L 29/08* | (2006.01) |
| *H01L 29/10* | (2006.01) |
| *H01L 29/16* | (2006.01) |
| *H01L 29/32* | (2006.01) |
| *H01L 29/66* | (2006.01) |
| *H01L 21/322* | (2006.01) |
| *H01L 29/739* | (2006.01) |
| *H01L 29/744* | (2006.01) |
| *H01L 29/861* | (2006.01) |
| *H01L 29/868* | (2006.01) |

(52) U.S. Cl.
CPC ...... *H01L 29/0615* (2013.01); *H01L 29/0878* (2013.01); *H01L 29/1095* (2013.01); *H01L 29/1608* (2013.01); *H01L 29/32* (2013.01); *H01L 29/868* (2013.01); *H01L 29/8611* (2013.01); *H01L 29/7395* (2013.01); *H01L 29/744* (2013.01)

(58) Field of Classification Search
CPC ............ H01L 29/0615; H01L 29/8611; H01L 29/1608; H01L 29/868; H01L 21/046; H01L 21/322; H01L 29/95; H01L 29/878; H01L 29/7395; H01L 29/744
USPC .......................................................... 257/77
See application file for complete search history.

(56) References Cited

U.S. PATENT DOCUMENTS

| | | | |
|---|---|---|---|
| 7,737,011 B2 * | 6/2010 | Tsuchida ................. | C30B 29/36 438/518 |
| 7,754,589 B2 | 7/2010 | Tsuchida et al. | |
| 7,834,362 B2 | 11/2010 | Tsuchida et al. | |
| 8,815,708 B2 | 8/2014 | Tsuchida et al. | |
| 2006/0151806 A1 * | 7/2006 | Fukuda ............... | H01L 21/0445 257/155 |
| 2006/0220027 A1 * | 10/2006 | Takahashi ............. | H01L 21/046 257/77 |
| 2009/0186470 A1 * | 7/2009 | Takahashi ............. | H01L 21/046 438/522 |
| 2012/0018743 A1 * | 1/2012 | Hiyoshi ................ | H01L 21/049 257/77 |
| 2014/0084303 A1 * | 3/2014 | Shimizu ................ | H01L 29/086 257/77 |
| 2014/0209927 A1 | 7/2014 | Nishio et al. | |
| 2014/0246755 A1 * | 9/2014 | Yoshimura .............. | H01L 29/32 257/617 |
| 2016/0149056 A1 * | 5/2016 | Nishio ................ | H01L 29/8611 257/77 |

FOREIGN PATENT DOCUMENTS

| | | |
|---|---|---|
| JP | 2008-53667 A | 3/2008 |
| JP | 4141505 B2 | 8/2008 |
| JP | 2014-17325 A | 1/2014 |
| JP | 2014-146748 A | 8/2014 |

OTHER PUBLICATIONS

Toru Hiyoshi, et al., "Elimination of the Major Deep Levels in n- and p- Type 4H-SiC by Two-Step Thermal Treatment", Applied Physics Express, vol. 2, Total 3 Pages, (2009).

Koutarou Kawahara, et al., "Reduction of deep levels generated by ion implantation into n- and p- type 4H-SiC", Journal of Applied Physics, vol. 108, Total 7 Pages, (2010).

International Search Report dated Dec. 9, 2014 in PCT/JP14/073058 Filed Sep. 2, 2014.

* cited by examiner

F I G. 2 2
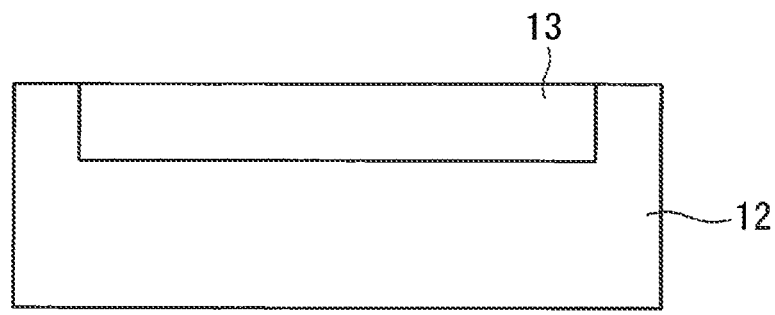
F I G. 2 3
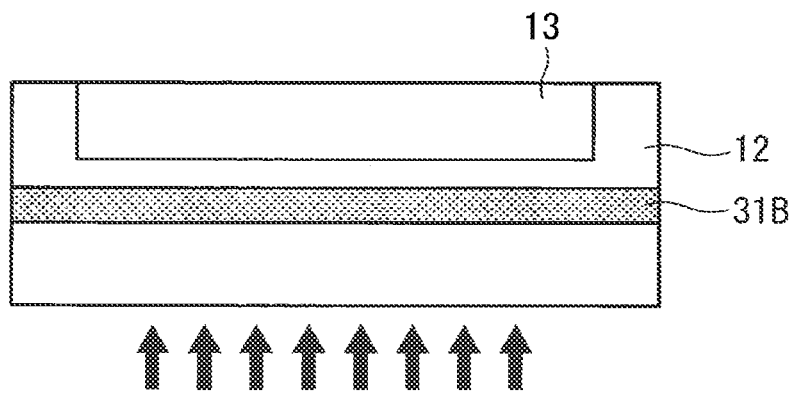
F I G. 2 4
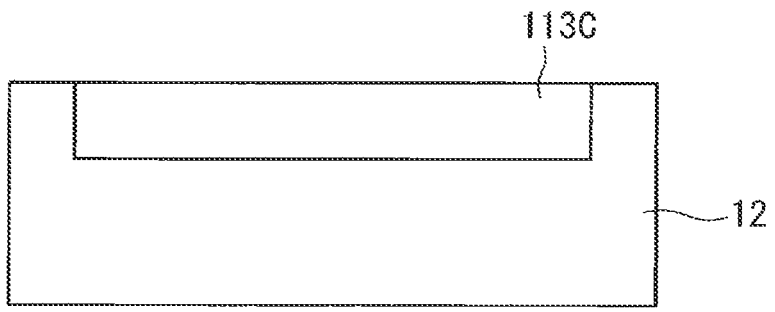

SIC SEMICONDUCTOR DEVICE HAVING PN JUNCTION INTERFACE AND METHOD FOR MANUFACTURING THE SIC SEMICONDUCTOR DEVICE

TECHNICAL FIELD

The present invention improves electrical characteristics of a semiconductor device.

BACKGROUND ART

There have been power semiconductor devices including a silicon carbide (SiC) substrate, such as a Schottky diode, a pn diode, a metal oxide semiconductor field effect transistor (MOSFET), and an insulated gate bipolar transistor (IGBT). SiC has dielectric breakdown electric field strength greater than that of Si, so that the semiconductor devices including the SiC substrate can also be used in an extra-high-voltage region (greater than or equal to 10 kV) to which Si is not applicable.

In the extra-high-voltage region, a drift layer having a low concentration and a great thickness is used to keep withstand pressure. Consequently, when a semiconductor device is used as a unipolar device, a drift resistance and an ON resistance are likely to increase. Thus, a bipolar device is often used to reduce the ON resistance. Examples of a bipolar device include a pn diode and an IGBT, for example. In the bipolar device, carriers including both electrons and positive holes contribute to conduction, so that a drift layer at a low concentration seemingly functions as if the drift layer is doped at a high concentration (conductivity modulation effects), and the ON resistance is significantly reduced.

To discuss performance of the bipolar device, a time constant (lifetime of carriers) in which excess carriers disappear due to recombination is an important index. The longer lifetime further enhances the conductivity modulation effects in the bipolar device. As a result, the ON resistance can be reduced. On the other hand, if the lifetime is too long, the accumulation of the carriers reduces switching characteristics of the bipolar device, which increases a switching loss. Therefore, the lifetime needs to be properly controlled according to the intended purpose of the device.

In indirect transition semiconductors such as Si and SiC that are normally used as materials for power devices, the lifetime increases because a recombination speed of an electron and a positive hole between bands is slow. On the other hand, however, the band gap have an energy level (defect level) when the semiconductor materials have impurities, intrinsic defects, and crystal defects such as dislocation, and stacking faults. The electron and the positive hole recombine with each other through the defect level in some cases, and the defect is referred to as a recombination center. With a plurality of recombination centers, the lifetime of the semiconductor material is represented by an inverse of a sum of an inverse of a lifetime in each recombination process. Thus, a process in which a lifetime is the shortest among the plurality of recombination processes limits the rate of the lifetime of the semiconductor material.

Therefore, in an indirect transition semiconductor, a lifetime is not a transition between intrinsic band gaps of a semiconductor material, and a lifetime is determined by a recombination center. Particularly, the recombination center that is a main cause of reducing a lifetime is referred to as a lifetime killer.

Many results of research for the purpose of specifying a defect being a lifetime killer of SiC or reducing the lifetime killer have been reported.

Mr. Zhang has specified a defect being a lifetime killer among electrically active defects (referred to as recombination centers or carrier traps) in an as-grown SiC layer by using the deep level transient spectroscopy (DLTS) and the minority carrier transient spectroscopy (MCTS) (Non-Patent Document 1). According to Non-Patent Document 1, electron traps by intrinsic defects and positive hole traps by boron impurities at the Z1/Z2 and EH6/7 centers are measured. Since a density of Z1/Z2 traps or a density of EH6/7 traps particularly indicates an inverse correlation with a lifetime, it is suggested that the Z1/Z2 traps or the EH6/7 traps are lifetime killers.

Mr. Hiyoshi has proposed the model in which thermal oxidation of an as-grown SiC epitaxial layer disperses interstitial carbon atoms ejected into the SiC layer in the thermal oxidation process, and thus the interstitial carbon atoms fill carbon vacancies in the as-grown SiC epitaxial layer, indicating that the thermal oxidation reduces a density of Z1/Z2 traps or a density of EH6/7 traps (Non-Patent Document 2).

Mr. Tsuchida has proposed the method of making traps electrically inert by implanting ions in an SiC crystal layer to additionally introduce interstitial carbon atoms in a shallow surface layer. Furthermore, by heating the SiC crystals, the interstitial carbon atoms additionally introduced in the surface layer are dispersed to the deeper area while the interstitial carbon atoms are combined with the carbon vacancies in the SiC crystal layer (Patent Document 1).

Mr. Kawahara has researched traps generated in ion implantation by ion-implanting impurity (dopant) atoms such as aluminum, phosphorus, and nitrogen in a surface of an SiC layer and also by performing DLTS evaluation on an element structure electrically activated by high-temperature annealing (Non-Patent Document 3). Non-Patent Document 3 discloses that particularly Z1/Z2 traps or EH6/7 traps are generated at a high concentration by the ion implantation and the traps are decreasingly distributed from the surface of the SiC layer toward the deeper area.

It has been proposed that dopant atoms such as aluminum and boron are ion-implanted in a surface of an SiC layer, and carbon atoms are simultaneously ion-implanted therein when an element structure is formed by electrically activating impurities in the surface layer through annealing in the process of manufacturing an SiC device (Patent Document 2). According to Patent Document 2, by ion-implanting carbon with boron in the surface of the SiC layer and introducing the surplus interstitial carbon atoms, the introduced surplus interstitial carbon atoms occupy carbon vacancies first, and boron is selectively introduced to silicon vacancies instead of the carbon vacancies at the time of annealing for electrically activating the impurities. As a result, it is indicated that a rate of boron that is electrically active is increased (a rate of activated boron is improved) more than the case of ion-implanting boron alone.

PRIOR ART DOCUMENT

Patent Document

Patent Document 1: Japanese Patent Application Laid-Open No. 2008-53667
Patent Document 2: Japanese Patent No. 4141505

Non-Patent Document

Non-Patent Document 1: J. Zhang, "Journal of Applied Physics, Vol. 93, No. 8," 2003, pp. 4708-4714
Non-Patent Document 2: Tom Hiyoshi, "Applied Physics Express, Vol. 2," 2009, pp. 091101
Non-Patent Document 3: Koutarou Kawahara, "Journal of Applied Physics, Vol. 108," 2010, pp. 033706

SUMMARY OF INVENTION

Problems to be Solved by the Invention

In a bipolar device used in an extra-high-voltage region (for example, greater than or equal to 10 kV), conductivity modulation effects are actively used to reduce an ON resistance. It is important here that minority carriers are injected in a conductivity modulation layer (drift layer), which is a key to the conductivity modulation, through a pn junction interface.

When the drift layer is an n-semiconductor, positive holes are minority carriers. The more minority carriers injected through the pn junction interface further enhances the conductivity modulation effects. As a result, the ON resistance is reduced. On the other hand, in a case where many electrically active defects such as carbon vacancies, namely, carrier traps occur close to (for example, within 500 nm from) the pn junction interface, the injection of the minority carriers is hampered, which reduces the conductivity modulation effects. This leads to a unipolar action (in which carriers including electrons or carriers including positive holes contribute to conduction), and thus the ON resistance is not reduced.

As described above, particularly in the case where the pn junction is formed by the ion implantation, the carrier traps are formed not only in the surface of the SiC layer but also close to the pn junction interface. This reduces the conductivity modulation effects, and the ON resistance cannot be reduced.

The present invention has been made in view of the above mentioned problems, and an object thereof is to provide a semiconductor device capable of reducing an ON resistance in a bipolar device and a method for manufacturing the same.

Means to Solve the Problems

A method for manufacturing a semiconductor device according to one aspect of the present invention includes: a drift layer formation step of forming a drift layer of a first conductivity type on a silicon carbide semiconductor substrate; an ion implanted layer formation step of implanting impurity ions being impurities of a second conductivity type in a surface of the drift layer to form an ion implanted layer in which the impurity ions are implanted; a surplus carbon region formation step of implanting interstitial carbon inducing ions that induce carbon between lattices in the drift layer to form a surplus carbon region having surplus interstitial carbon atoms; and a heating step of heating the drift layer after the ion implanted layer formation step and after the surplus carbon region formation step. The surplus carbon region formation step implants the interstitial carbon inducing ions in a region deeper than an interface between the ion implanted layer and the drift layer to form the surplus carbon region. The heating step heats the drift layer to activate the impurity ions implanted in the ion implanted layer in order to form an activation layer of the second conductivity type while the heating step heats the drift layer to disperse the interstitial carbon atoms toward the activation layer.

A method for manufacturing a semiconductor device according to another aspect of the present invention includes: a drift layer formation step of forming a drift layer of a first conductivity type on a silicon carbide semiconductor substrate; an ion implanted layer formation step of implanting impurity ions being impurities of a second conductivity type in a surface of the drift layer to form an ion implanted layer in which the impurity ions are implanted; a substrate removal step of removing the silicon carbide semiconductor substrate; a protective film formation step of forming a protective film at least on a surface of the ion implanted layer after the substrate removal step; a thermal oxide film formation step of forming a thermal oxide film on the surface of the drift layer and a back surface of the drift layer after the protective film formation step; a film removal step of removing the protective film and the thermal oxide film; and a heating step of heating the drift layer after the ion implanted layer formation step. The thermal oxide film formation step forms the thermal oxide film to cause interstitial carbon atoms to be ejected into the drift layer. The heating step heats the drift layer to activate the impurity ions implanted in the ion implanted layer in order to form an activation layer of the second conductivity type.

A semiconductor device according to one aspect of the present invention includes a drift layer of the first conductivity type formed on a silicon carbide semiconductor substrate and an activation layer of a second conductivity type formed in a predetermined region on a surface side of the drift layer. A relationship among a carrier lifetime A (ns) in a surface of the activation layer, a carrier lifetime B (ns) in an interface between the activation layer and the drift layer, and a thickness T (μm) of the drift layer satisfies B≥A×10 and B≥0.3×T².

Effects of the Invention

According to the above-mentioned aspects of the present invention, the surplus carbon region is formed in the region deeper than the interface between the ion implanted layer and the drift layer, and the interstitial carbon atoms are dispersed toward the activation layer by heating the drift layer. Thus, the carrier traps close to the pn junction interface can be effectively reduced or removed. Therefore, the ON resistance of the semiconductor device can be reduced.

These and other objects, features, aspects and advantages of the present invention will become more apparent from the following detailed description of the present invention when taken in conjunction with the accompanying drawings.

BRIEF DESCRIPTION OF DRAWINGS

FIG. 22 is a cross-sectional view for describing a process of manufacturing the semiconductor device according to the fourth embodiment.

FIG. 23 is a cross-sectional view for describing a process of manufacturing the semiconductor device according to the fourth embodiment.

FIG. 24 is a cross-sectional view for describing a process of manufacturing the semiconductor device according to the fourth embodiment.

DESCRIPTION OF EMBODIMENTS

<First Embodiment>
<Manufacturing Method>

FIGS. 1 to 4 are cross-sectional views schematically showing processes of manufacturing a semiconductor device in which carrier traps close to (for example, within 500 nm from) a pn junction interface are reduced or removed by using a method for manufacturing a semiconductor device according to this embodiment.

Figure 1:
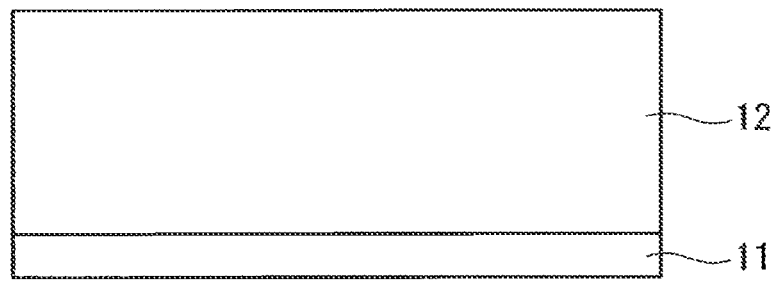
FIG. 1 is a cross-sectional view for describing a process of manufacturing a semiconductor device according to a first embodiment.

First, epitaxial growth is performed on a first main surface (front surface) of an SiC substrate 11 of an n-type with a predetermined dopant. Thus, as shown in FIG. 1, an SiC epitaxial layer 12 (or also called an epilayer) of the n-type is formed on the first main surface of the SiC substrate 11 of the n-type.

Herein, the above-mentioned silicon carbide (SiC) is a kind of wide band gap semiconductor. A wide band gap semiconductor typically represents a semiconductor having a band gap width of approximately 2 eV or more. A group III-nitride typified by gallium nitride (GaN), a group II-oxide typified by zinc oxide (ZnO), a group II-chalcogenide typified by zinc selenide (ZnSe), and silicon carbide are known as a wide band gap semiconductor. In this embodiment, silicon carbide is used in descriptions, but another semiconductor and a wide band gap semiconductor are similarly applicable.

Figure 2:
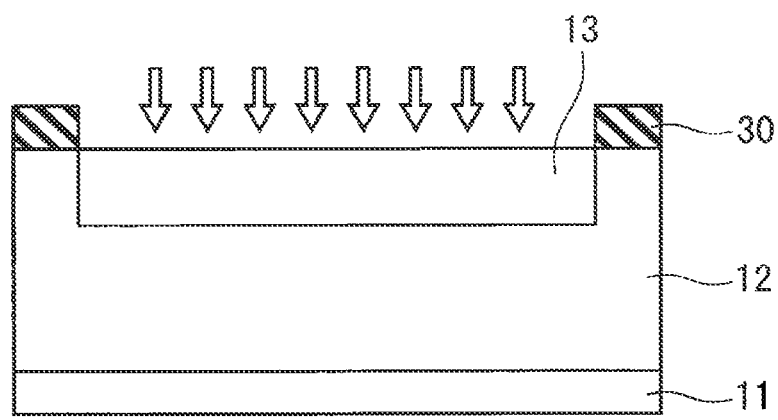
FIG. 2 is a cross-sectional view for describing a process of manufacturing the semiconductor device according to the first embodiment.

Next, ion implantation of p-dopant atoms is performed in a predetermined region (partial region) of the first main surface of the SiC epitaxial layer 12 through an implantation mask 30. Examples of dopant atoms include aluminum, boron, phosphorus, and nitrogen, for example. A photomechanical photoresist or an oxide film, for example, is used as the implantation mask 30. Thus, as shown in FIG. 2, an ion implanted layer 13 in which the dopant ions (impurity ions) are implanted is formed in the first main surface of the SiC epitaxial layer 12. Herein, the ion implantation may be performed with single implantation energy or performed with implantation energy that is gradually changed from, for example, high to low. An implantation surface density during the ion implantation is preferably in a range of $1\times10^{13}$ cm$^{-2}$ to $1\times10^{16}$ cm$^{-2}$. Implantation energy during the ion implantation is preferably in a range of 10 keV to 10 MeV. The SiC layer in the ion implantation preferably has a temperature in a range of 10° C. to 1000° C., more preferably in a range of 200° C. to 800° C.

Figure 3:
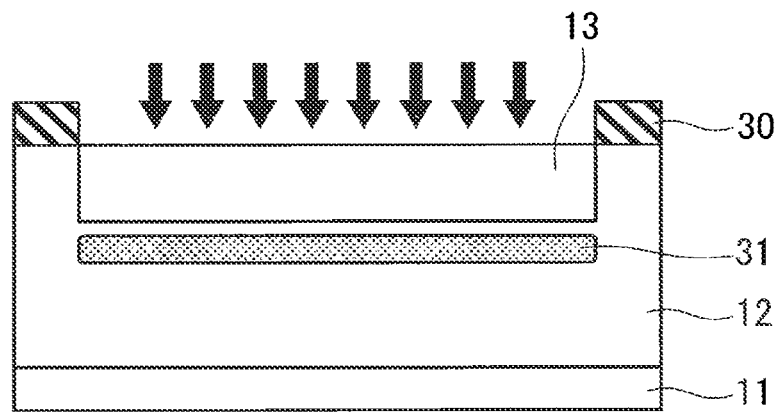
FIG. 3 is a cross-sectional view for describing a process of manufacturing the semiconductor device according to the first embodiment.

Next, interstitial carbon inducing ions that induce carbon between lattices are further implanted in the predetermined region of the first main surface of the SiC epitaxial layer 12. Examples of interstitial carbon inducing ions include carbon, silicon, hydrogen, and helium, for example. Thus, as shown in FIG. 3, a surplus carbon region 31 having surplus interstitial carbon atoms is formed. Herein, it is important that the surplus carbon region 31 having the surplus interstitial carbon atoms is formed in the region (in which a direction far away from the first main surface in the SiC epitaxial layer 12 is a depth direction) deeper than the interface between the ion implanted layer 13 and the SiC epitaxial layer 12. More specifically, the surplus carbon region 31 is formed on the deeper region side close to the interface between the ion implanted layer 13 and the SiC epitaxial layer 12. The surplus carbon region 31 is preferably formed on the deeper region side within 500 nm from the interface between the ion implanted layer 13 and the SiC epitaxial layer 12. Herein, the ion implantation may be performed with single implantation energy or performed with implantation energy that is gradually changed from, for example, high to low. An implantation surface density during the ion implantation is preferably in a range of $1\times10^{13}$ cm$^{-2}$ to $1\times10^{16}$ cm$^{-2}$. Implantation energy during the ion implantation is preferably in a range of 10 keV to 10 MeV. The SiC layer in the ion implantation preferably has a temperature in a range of 10° C. to 1000° C., more preferably in a range of 200° C. to 800° C. The implantation energy in the ion implantation is preferably greater than the implantation energy previously used for implanting the ions of the dopant atoms. Thus, the surplus carbon region 31 having the surplus interstitial carbon atoms can be formed in the region deeper than the interface between the ion implanted layer 13 and the SiC epitaxial layer 12. Moreover, the implantation surface density in the ion implantation is preferably selected so as to exceed a density of carrier traps (for example, higher than or equal to $1\times10^{13}$ cm$^{-2}$) that may be generated close to (for example, within 500 nm from) a pn junction interface (interface between the ion implanted layer 13 and the SiC epitaxial layer 12). In this embodiment, the interstitial carbon inducing ions are implanted after the dopant ions are implanted, but the order may be changed.

Figure 4:
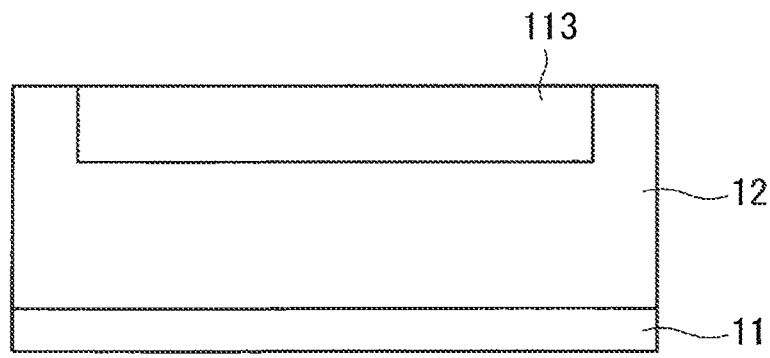
FIG. 4 is a cross-sectional view for describing a process of manufacturing the semiconductor device according to the first embodiment.

Subsequently, heating the SiC epitaxial layer 12 activates the dopant atoms in the ion implanted layer 13 while dispersing the interstitial carbon atoms toward the ion implanted layer 13 to be combined with point defects close to the pn junction interface. Thus, as shown in FIG. 4, an activation layer 113 of a p-type is formed while the carrier traps particularly close to the pn junction interface are reduced or removed. Herein, a heating temperature of the SiC epitaxial layer 12 is preferably in a range of 1000° C. to 2000° C., more preferably in a range of 1400° C. to 1800° C.

Figure 5:
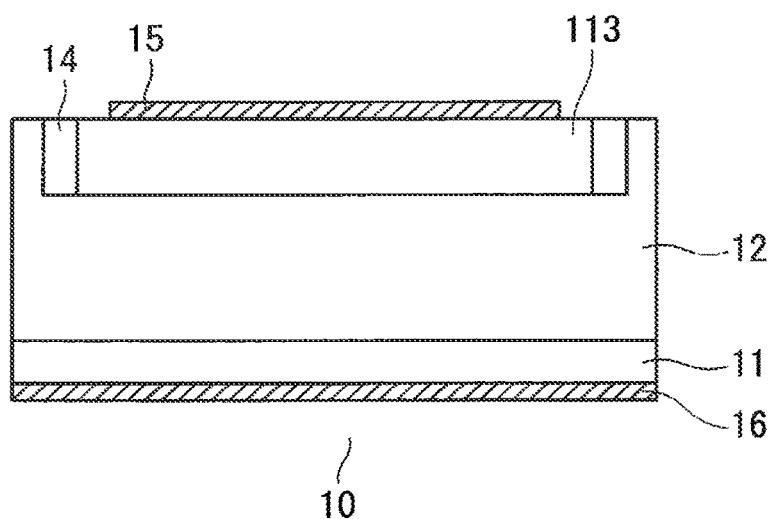
FIG. 5 is a cross-sectional view schematically showing an element structure of the SiC semiconductor device manufactured by using the method for manufacturing a semiconductor device according to the first embodiment.

FIG. 5 is a cross-sectional view schematically showing an element structure of the SiC semiconductor device (pn diode) manufactured by using the method for manufacturing a semiconductor device according to this embodiment.

As shown in FIG. 5, an pn diode 10 using SiC includes the SiC substrate 11, the SiC epitaxial layer 12 (drift layer), the activation layer 113 (anode region), an electric field relaxation region 14, an anode electrode 15, and a cathode electrode 16.

The SiC epitaxial layer 12 (drift layer) is an n-type layer that is epitaxially grown on the first main surface of the SiC substrate 11 of the n-type at a high concentration and that has a concentration lower than that of the SiC substrate 11. The activation layer 113 (anode region) is a p-type layer at a high concentration that is formed, by the ion implantation, in the predetermined region in the surface of the SiC epitaxial layer 12 of the n-type at the low concentration. The electric field relaxation region 14 is a p-type region that is formed, by the ion implantation, in the predetermined region in the surface of the SiC epitaxial layer 12 of the n-type at the low concentration and that has a concentration lower than that of the activation layer 113. The anode electrode 15 is an electrode formed on the surface of the activation layer 113 (anode region). The cathode electrode 16 is an electrode formed on a second main surface (a surface opposite to the first main surface, namely, a back surface) of the SiC substrate 11.

In the pn diode 10, point defects that are electrically active are combined with interstitial carbon atoms particularly close to the pn junction interface, which reduces or removes the carrier traps. This accelerates an injection of minority carriers into the pn interface, and excellent electrical characteristics can be achieved.

<Effects>

In this embodiment, the method for manufacturing a semiconductor device forms the SiC epitaxial layer 12 as a drift layer of a first conductivity type (for example, an n-type) on the SiC substrate 11 as a silicon carbide semiconductor substrate. The impurity ions being impurities of a second conductivity type (for example, a p-type) are implanted in the surface of the SiC epitaxial layer 12 to form the ion implanted layer 13 in which the impurity ions are implanted. The interstitial carbon inducing ions that induce carbon between lattices are implanted in the SiC epitaxial layer 12 to form the surplus carbon region 31 having the surplus interstitial carbon atoms. After the ion implanted layer 13 is formed and after the surplus carbon region 31 is formed, the SiC epitaxial layer 12 is heated.

In the case where the surplus carbon region 31 is formed, the interstitial carbon inducing ions are implanted in the region deeper than the interface between the ion implanted layer 13 and the SiC epitaxial layer 12 to form the surplus carbon region 31. In the case where the SiC epitaxial layer 12 is heated, heating the SiC epitaxial layer 12 activates the impurity ions implanted in the ion implanted layer 13 to form the activation layer 113 of the second conductivity type while heating the SiC epitaxial layer 12 disperses the interstitial carbon atoms toward the activation layer 113.

In addition, the surplus carbon region 31 may be replaced with a surplus carbon region 31A described below. At the same time, the activation layer 113 may be replaced with an activation layer 113A described below.

This configuration can effectively reduce or remove the carrier traps close to the pn junction interface by forming the surplus region 31 in the region deeper than the interface between the ion implanted layer 13 and the SiC epitaxial layer 12 and also by heating the SiC epitaxial layer 12 to disperse the interstitial carbon atoms toward the activation layer 113. This accelerates the injection of the minority carriers through the pn injection interface, and an ON resistance of the semiconductor device can be reduced.

Since the interstitial carbon inducing ions are implanted in the region deeper than the interface between the ion implanted layer 13 and the SiC epitaxial layer 12, the interstitial carbon atoms can be introduced in the surplus carbon region 31 while avoiding the surface of the ion implanted layer 13 in which the carrier traps are generated at a higher concentration. Thus, when the SiC epitaxial layer 12 is heated to disperse the interstitial carbon atoms, the point defects close to the pn junction interface can be combined with the interstitial carbon atoms more effectively than the case in which the interstitial carbon inducing ions are implanted in the surface of the ion implanted layer 13. Therefore, the implantation surface density of the interstitial carbon atoms does not need to be made at a high concentration, and it suffices that the implantation surface density exceeds the density of the carrier traps at a lower concentration close to the pn junction interface.

In a case where the surplus carbon region is formed in a region shallower than the interface between the ion implanted layer 13 and the SiC epitaxial layer 12, the interstitial carbon inducing ions having a higher implantation surface density of the interstitial carbon atoms need to be implanted when heating the SiC epitaxial layer 12 disperses the interstitial carbon atoms such that the dispersion of the interstitial carbon atoms reaches the point defects close to the pn junction interface. The carrier traps are generated at a higher concentration in the surface of the ion implanted surface 13, so that the interstitial carbon inducing ions having the implantation surface density that exceeds the density of the carrier traps in the above-mentioned region need to be introduced. At a high implantation surface density of ions that are implanted, new implantation defects may occur.

In this embodiment, in the case where the surplus carbon region 31 is formed, the interstitial carbon inducing ions having the implantation surface density higher than the density of the carrier traps in the interface between the ion implanted layer 13 and the SiC epitaxial layer 12 are implanted to form the surplus carbon region 31.

This configuration can sufficiently reduce or remove the carrier traps in the interface between the ion implanted layer 13 and the SiC epitaxial layer 12 by implanting the interstitial carbon inducing ions.

Figure 25:
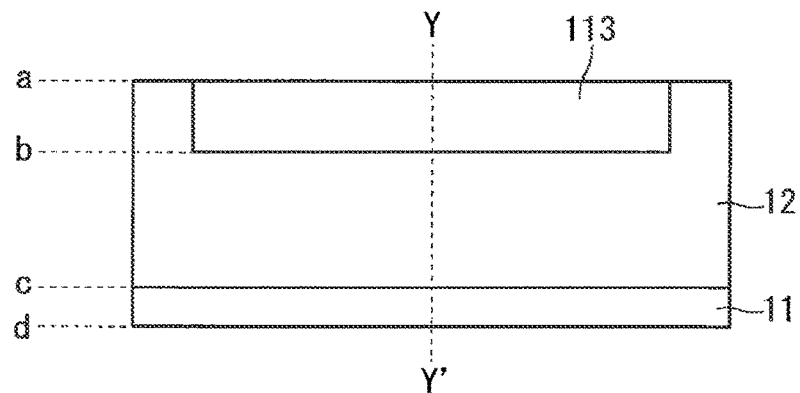
FIG. 25 is a diagram for describing a profile of carrier lifetime in the SiC semiconductor device manufactured by using the method for manufacturing a semiconductor device according to the first embodiment.
Figure 26:
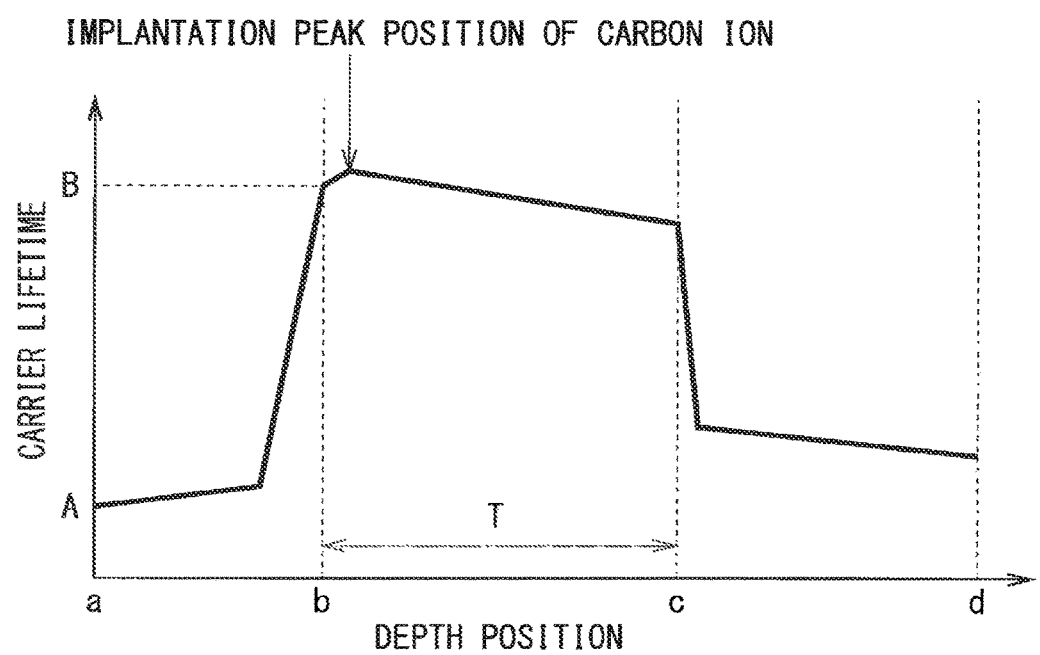
FIG. 26 is a diagram for describing a profile of carrier lifetime in the SiC semiconductor device manufactured by using the method for manufacturing a semiconductor device according to the first embodiment.

FIGS. 25 and 26 are diagrams for describing a profile of carrier lifetime in the SiC semiconductor device (pn diode) manufactured by using the method for manufacturing a semiconductor device according to this embodiment. FIG. 26 schematically shows carrier lifetime in a Y-Y' section (in a thickness direction of the substrate) of the pn diode shown in FIG. 25. In FIG. 26, the vertical axis represents carrier lifetime, and the horizontal axis represents a depth position in the Y-Y' section.

In FIG. 25, a, b, c, and d each represent the corresponding depth positions of the surface of the activation layer 113, the interface (pn junction interface) between the lower surface of the activation layer 113 and the SiC epitaxial layer 12, the interface between the SiC epitaxial later 12 and the SiC substrate 11, and the back surface of the SiC substrate 11.

In FIG. 26, A represents carrier lifetime in the position a (surface of the activation layer), and B represents carrier lifetime in the position b (pn junction interface). T represents a length between the positions b and c (thickness of the drift layer).

In this embodiment, it is assumed that the activation layer (anode layer in the case of the pn diode) is formed by ion-implanting the dopant such as aluminum, so that many carrier traps are formed even close to the pn junction interface, and this case is different from the case where the activation layer is epitaxially grown.

The minority carriers are injected through the pn junction interface, and thus it is important to actively remove or reduce the carrier traps in the pn junction interface in order to accelerate conductivity modulation to reduce the ON resistance of the device.

In this embodiment, the carbon ions at the implantation surface density higher than the density of the carrier traps in the pn junction interface are implanted in the region deeper than the pn junction interface, to thereby form the surplus carbon region. Thus, the carrier traps in the pn junction interface can be actively removed or reduced. Consequently, as shown in FIG. 26, the profile of the carrier lifetime is achieved such that the carrier lifetime B in the position b (pn junction interface) with respect to the carrier lifetime A in the position a (surface of the activation layer) satisfies $$B \gg A. \quad \text{[Math 1]}$$

The carrier traps in the surface of the activation layer are not sufficiently reduced, and thus the carrier lifetime is short.

As shown in FIG. 26, the implanted carbon ions are dispersed from, as the starting point, an implantation peak position in the thickness direction of the substrate, and thus the profile has the carrier lifetime that takes on a maximum value in the implantation peak position of the carbon ions and that is gradually decreased toward the position b or the position c. For a relationship among A, B, and T, $$B \geq A \times 10 \text{ and } B \geq 0.3 \times T^2 \text{ (unit of } B: ns, \text{ unit of } T: \mu m) \quad \text{[Math 2]}$$

is preferable. For example, when the carrier lifetime A in the surface of the activation layer is assumed to be 100 ns and the thickness T of the drift layer is assumed to be 100 μm, an implantation surface density of the carbon ions and implantation energy are preferably selected such that the carrier lifetime B in the pn junction interface is greater than or equal to 3 μs. If $$B < 3 \text{ μs}, \quad \text{[Math 3]}$$

the minority carriers for sufficient conductivity modulation performed on the drift layer cannot be supplied from the activation layer, and thus the ON resistance of the device cannot be reduced.

<Second Embodiment>
<Manufacturing Method>

FIGS. 6 to 10 are cross-sectional views schematically showing processes of manufacturing a semiconductor device in which carrier traps close to the pn junction interface are reduced or removed by using a method for manufacturing a semiconductor device according to this embodiment. In addition, the same details as those in the first embodiment are not described as appropriate.

Figure 6:
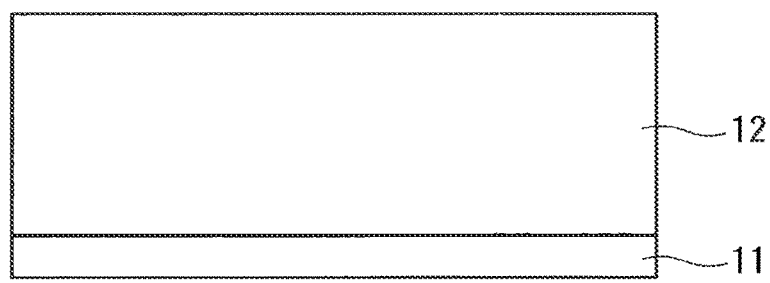
FIG. 6 is a cross-sectional view for describing a process of manufacturing a semiconductor device according to a second embodiment.
Figure 7:
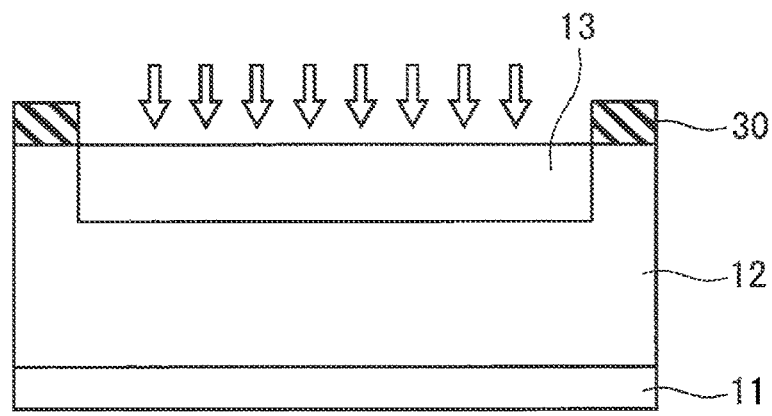
FIG. 7 is a cross-sectional view for describing a process of manufacturing the semiconductor device according to the second embodiment.

First, epitaxial growth is performed on the first main surface of the SiC substrate 11 of the n-type with a predetermined dopant (see FIG. 6). Next, ion implantation of dopant atoms is performed in a predetermined region of the first main surface of the SiC epitaxial layer 12 through the implantation mask 30 (see FIG. 7).

Figure 8:
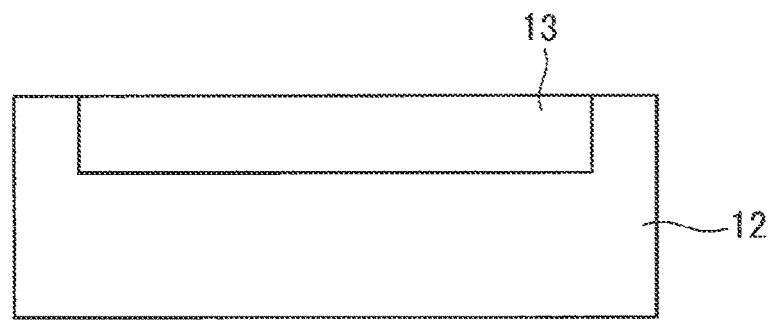
FIG. 8 is a cross-sectional view for describing a process of manufacturing the semiconductor device according to the second embodiment.

Next, the SiC substrate 11 is completely removed by etching or a mechanical technique. Thus, as shown in FIG. 8, the second main surface of the SiC epitaxial layer 12 is exposed.

Figure 9:
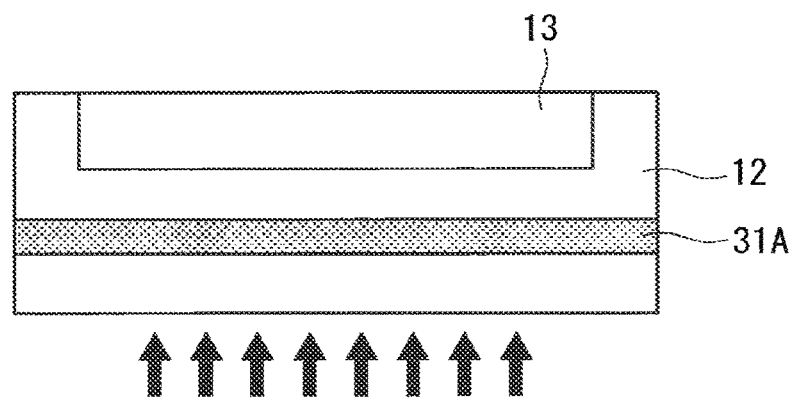
FIG. 9 is a cross-sectional view for describing a process of manufacturing the semiconductor device according to the second embodiment.

Next, interstitial carbon inducing ions are further ion-implanted in a predetermined region or the entire main surface of the second main surface of the SiC epitaxial layer 12. Examples of interstitial carbon inducing ions include carbon, silicon, hydrogen, and helium, for example. Thus, as shown in FIG. 9, a surplus carbon region 31A having surplus interstitial carbon atoms is formed. Herein, it is important that the surplus carbon region 31A having the surplus interstitial carbon atoms is formed in a region deeper than the interface between the ion implanted layer 13 and the SiC epitaxial layer 12. Herein, the ion implantation may be performed with single implantation energy or performed with implantation energy that is gradually changed from, for example, high to low. An implantation surface density during the ion implantation is preferably in a range of $1 \times 10^{13}$ cm$^{-2}$ to $1 \times 10^{16}$ cm$^{-2}$. Implantation energy during the ion implantation is preferably in a range of 10 keV to 10 MeV. The SiC layer in the ion implantation preferably has a temperature in a range of 10° C. to 1000° C., more preferably in a range of 200° C. to 800° C. Moreover, the implantation surface density in the ion implantation is preferably selected so as to exceed a density of carrier traps (for example, higher than or equal to $1 \times 10^{13}$ cm$^{-2}$) that may be generated close to (for example, within 500 nm from) the pn junction interface. In this embodiment, the SiC substrate 11 is removed after the dopant ions are implanted, and the interstitial carbon inducing ions are implanted, but the order may be changed.

Figure 10:
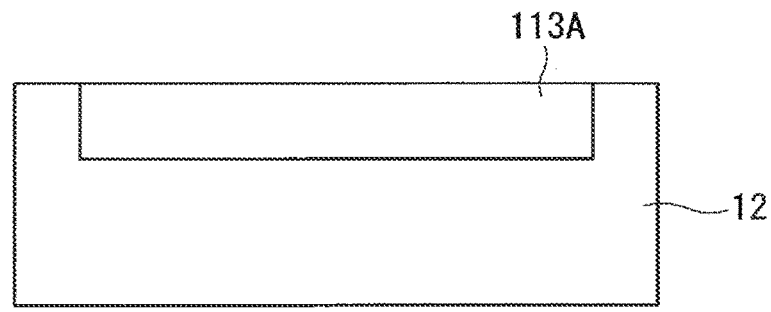
FIG. 10 is a cross-sectional view for describing a process of manufacturing the semiconductor device according to the second embodiment.

Subsequently, heating the SiC epitaxial layer 12 activates the dopant atoms in the ion implanted layer 13 while dispersing the interstitial carbon atoms toward the ion implanted layer 13 to be combined with point defects close to the pn junction interface. Thus, as shown in FIG. 10, an activation layer 113A of the p-type is formed while carrier traps particularly close to the pn junction interface are reduced or removed. Herein, a heating temperature of the SiC epitaxial layer 12 is preferably in a range of 1000° C. to 2000° C., more preferably in a range of 1400° C. to 1800° C.

Figure 11:
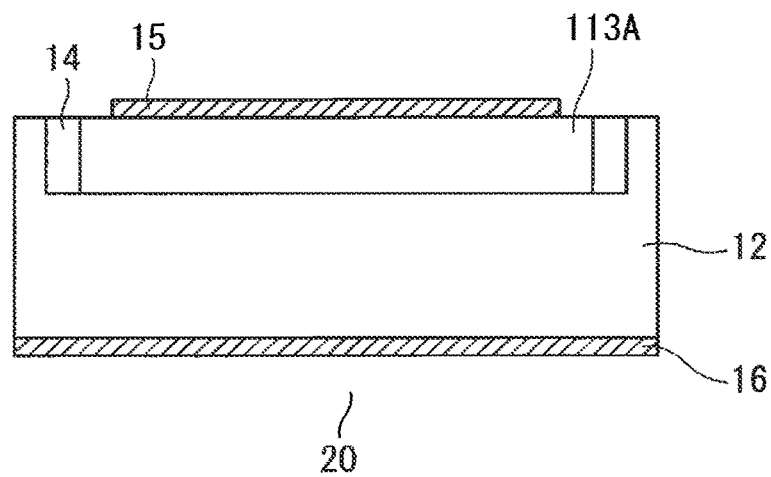
FIG. 11 is a cross-sectional view schematically showing an element structure of the SiC semiconductor device manufactured by using the method for manufacturing a semiconductor device according to the second embodiment.

FIG. 11 is a cross-sectional view schematically showing an element structure of the SiC semiconductor device (pn diode) manufactured by using the method for manufacturing a semiconductor device according to this embodiment.

As shown in FIG. 11, a pn diode 20 using SiC includes the SiC epitaxial layer 12 (drift layer), the activation layer 113A (anode region), the electric field relaxation region 14, the anode electrode 15, and the cathode electrode 16. The activation layer 113A (anode region) is a p-type layer at a high concentration that is formed by implanting ions in the predetermined region in the surface of the SiC epitaxial layer 12 of the n-type at a low concentration.

In the pn diode 20, the point defects that are electrically active are combined with the interstitial carbon atoms particularly close to the pn junction interface, which reduces or removes the carrier traps. This accelerates an injection of minority carriers into the pn interface, and excellent electrical characteristics can be achieved.

<Effects>

In this embodiment, the method for manufacturing a semiconductor device removes the SiC substrate 11 as a silicon carbide semiconductor substrate before the surplus carbon region 31A is formed. In the case where the surplus carbon region 31A is formed, the interstitial carbon inducing ions are implanted from the back surface of the SiC epitaxial layer 12 as a drift layer.

This configuration increases flexibility in a method for implanting interstitial carbon inducing ions.

<Third Embodiment>
<Manufacturing Method>

FIGS. 12 to 17 are cross-sectional views schematically showing processes of manufacturing a semiconductor device in which carrier traps close to the pn junction interface are reduced or removed by using a method for manufacturing a semiconductor device according to this embodiment. In addition, the same details as those in the first embodiment or the second embodiment are not described as appropriate.

Figure 12:
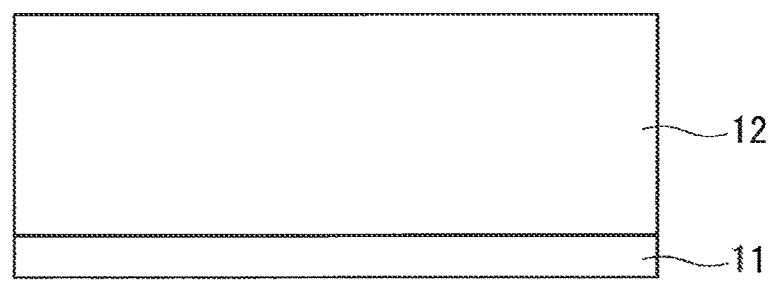
FIG. 12 is a cross-sectional view for describing a process of manufacturing a semiconductor device according to a third embodiment.
Figure 13:
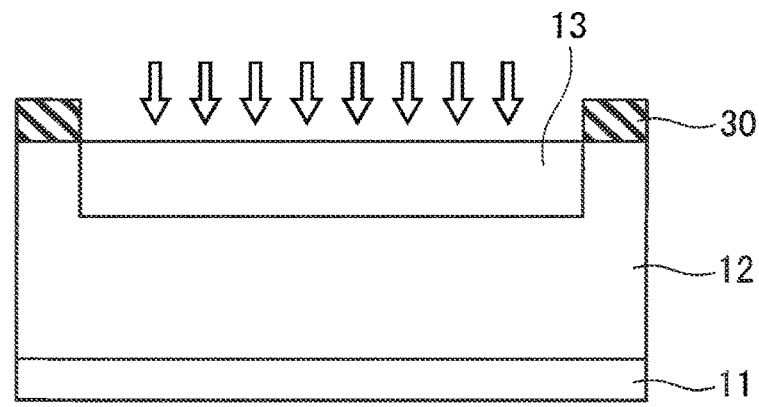
FIG. 13 is a cross-sectional view for describing a process of manufacturing the semiconductor device according to the third embodiment.

First, epitaxial growth is performed on the first main surface of the SiC substrate 11 of the n-type with a predetermined dopant (see FIG. 12). Next, ion implantation of dopant atoms is performed in a predetermined region of the first main surface of the SiC epitaxial layer 12 through the implantation mask 30 (see FIG. 13).

Figure 14:
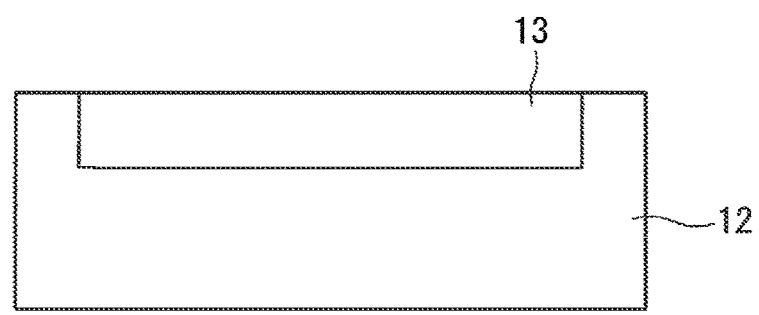
FIG. 14 is a cross-sectional view for describing a process of manufacturing the semiconductor device according to the third embodiment.

Next, the SiC substrate 11 is completely removed by etching or a mechanical technique (see FIG. 14).

Figure 15:
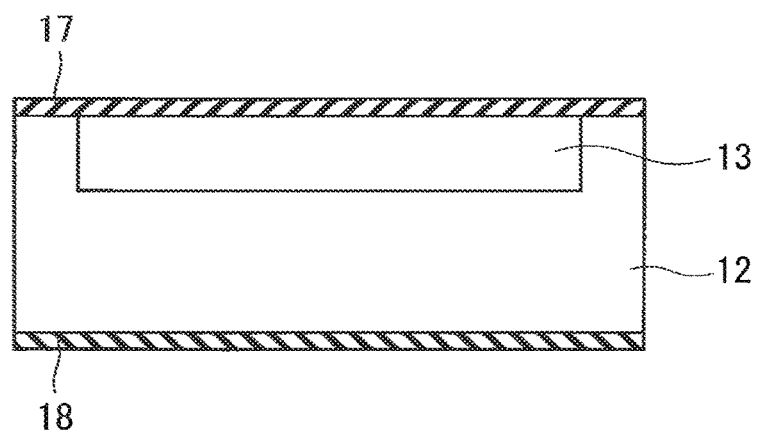
FIG. 15 is a cross-sectional view for describing a process of manufacturing the semiconductor device according to the third embodiment.

Next, a protective film 17 is formed on the first main surface of the SiC epitaxial layer 12 and the ion implanted layer 13. A deposited oxide film, for example, is used as the protective film 17. A thermal oxide film 18 is formed on the second main surface of the SiC epitaxial layer 12 by subsequent thermal oxidation. Since the protective film 17 is formed on the first main surface of the SiC epitaxial layer 12 and the ion implanted layer 13, the thermal oxide film 18 is not formed thereon. Herein, a thermal oxidation temperature is preferably in a range of 1000° C. to 1500° C., and thermal oxidation time is preferably in a range of 10 minutes to 100 hours. Thus, as shown in FIG. 15, the thermal oxide film 18 is formed only on the second main surface of the SiC epitaxial layer 12.

Herein, the protective film 17 may be formed on only the first main surface of the ion implanted layer 13 of the first main surface of the SiC epitaxial layer 12. In this case, the thermal oxide film 18 is formed on the region of the first main surface of the SiC epitaxial layer 12 in which the ion implanted layer 13 is not formed and the thermal oxide film 18 is formed on the second main surface of the SiC epitaxial layer 12 by the subsequent thermal oxidation. The thermal oxide film 18 is not formed on the first main surface of the ion implanted layer 13.

In the process of thermal oxidation described above, the thermal oxide film 18 is formed, so that the interstitial carbon atoms ejected into the SiC epitaxial layer 12 are combined with point defects in the SiC epitaxial layer 12 and close to the pn junction interface. This reduces or removes the carrier traps. Herein, a density of the point defects close to (for example, within 500 nm from) the pn junction interface is orders of magnitude higher than a density of the point defects in the SiC epitaxial layer 12, so that the interstitial carbon atoms are combined with the point defects mainly close to the pn junction interface.

Figure 16:
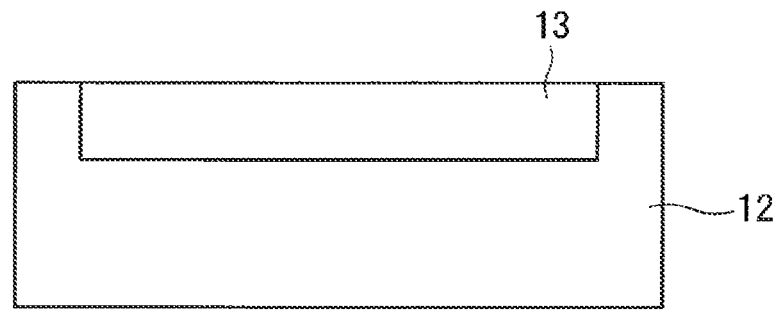
FIG. 16 is a cross-sectional view for describing a process of manufacturing the semiconductor device according to the third embodiment.

Next, as shown in FIG. 16, the protective film 17 and the thermal oxide film 18 are completely removed by etching or a mechanical technique.

Figure 17:
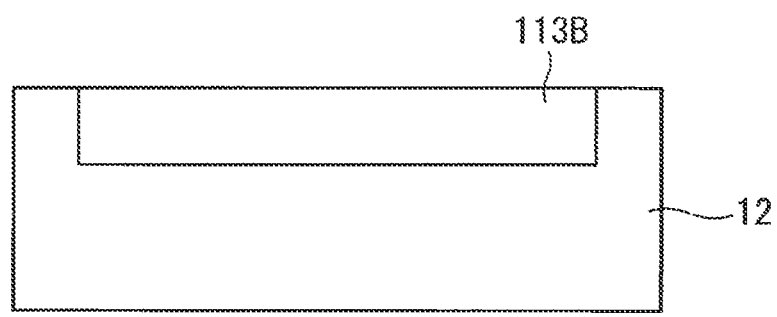
FIG. 17 is a cross-sectional view for describing a process of manufacturing the semiconductor device according to the third embodiment.

Subsequently, heating the SiC epitaxial layer 12 activates the dopant atoms in the ion implanted layer 13. Thus, as shown in FIG. 17, an activation layer 113B of the p-type is formed. A heating temperature of the SiC epitaxial layer 12 is preferably in a range of 1000° C. to 2000° C., more preferably in a range of 1400° C. to 1800° C.

<Effects>

In this embodiment, the method for manufacturing a semiconductor device forms the SiC epitaxial layer 12 as a drift layer of a first conductivity type (for example, an n-type) on the SiC substrate 11 as a silicon carbide semiconductor substrate. The impurity ions being impurities of a second conductivity type (for example, a p-type) are implanted in the surface of the SiC epitaxial layer 12 to form the ion implanted layer 13 in which the impurity ions are implanted. The SiC substrate 11 is removed. After the SiC substrate 11 is removed, the protective film 17 is formed at least on the surface of the ion implanted layer 13. After the protective film 17 is formed, the thermal oxide film 18 is formed on the surface of the SiC epitaxial layer 12 and the back surface of the SiC epitaxial layer 12. The protective film 17 and the thermal oxide film 18 are removed. After the ion implanted layer 13 is formed, the SiC epitaxial layer 12 is heated.

In the case where the thermal oxide film 18 is formed, forming the thermal oxide film 18 causes the interstitial carbon atoms to be ejected into the SiC epitaxial layer 12. In the case where the SiC epitaxial layer 12 is heated, heating the SiC epitaxial layer 12 activates the impurity ions implanted in the ion implanted layer 13, to thereby form the activation layer 113B of the second conductivity type.

This configuration can reduce or remove the carrier traps close to the pn junction interface by ejecting the interstitial carbon atoms into the SiC epitaxial layer 12 when the thermal oxide film 18 is formed. This accelerates the injection of the minority carriers through the pn injection interface, and the ON resistance of the semiconductor device can be reduced.

The surface of the ion implanted layer 13 is covered with the protective film 17, so that the thermal oxide film 18 is not formed on the surface of the ion implanted layer 13. Thus, when forming the thermal oxide film 18 causes the interstitial carbon atoms to be ejected into the SiC epitaxial layer 12, the interstitial carbon atoms can be introduced in the SiC epitaxial layer 12 while avoiding the surface of the ion implanted layer 13 in which the carrier traps are generated at a higher concentration.

<Fourth Embodiment>

<Manufacturing Method>

FIGS. 18 to 24 are cross-sectional views schematically showing processes of manufacturing a semiconductor device in which carrier traps close to the pn junction interface are reduced or removed by using a method for manufacturing a semiconductor device according to this embodiment. In addition, the same details as those in the first embodiment, the second embodiment, or the third embodiment are not described as appropriate.

Figure 18:
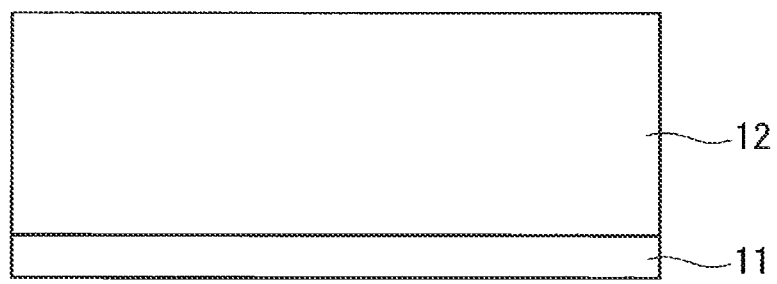
FIG. 18 is a cross-sectional view for describing a process of manufacturing a semiconductor device according to a fourth embodiment.
Figure 19:
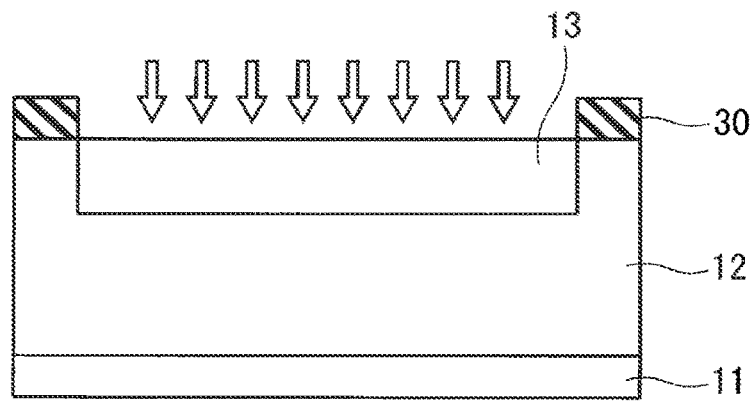
FIG. 19 is a cross-sectional view for describing a process of manufacturing the semiconductor device according to the fourth embodiment.

First, epitaxial growth is performed on the first main surface of the SiC substrate 11 of the n-type with a predetermined dopant (see FIG. 18). Next, ion implantation of dopant atoms is performed in a predetermined region of the first main surface of the SiC epitaxial layer 12 through the implantation mask 30 (see FIG. 19).

Figure 20:
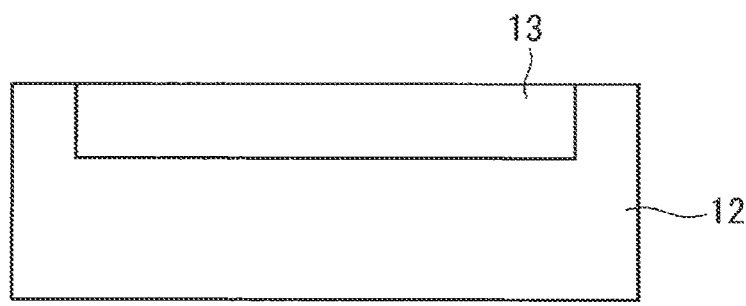
FIG. 20 is a cross-sectional view for describing a process of manufacturing the semiconductor device according to the fourth embodiment.
Figure 21:
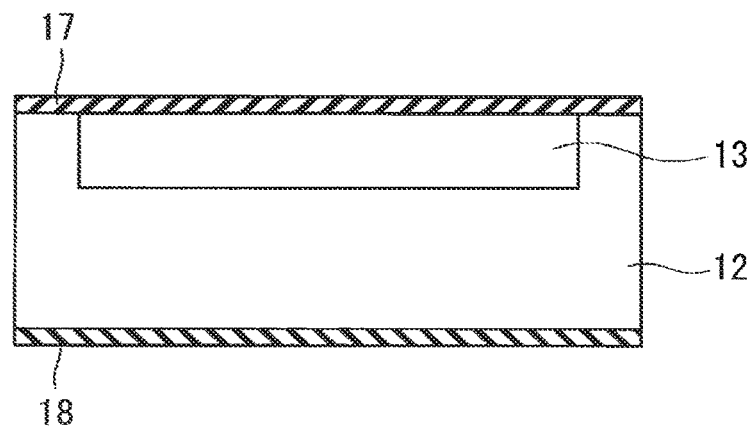
FIG. 21 is a cross-sectional view for describing a process of manufacturing the semiconductor device according to the fourth embodiment.

Next, the SiC substrate 11 is completely removed by etching or a mechanical technique (see FIG. 20).

Next, the protective film 17 is formed on the first main surface of the SiC epitaxial layer 12 and the ion implanted layer 13. The thermal oxide film 18 is formed on the second main surface of the SiC epitaxial layer 12 by subsequent thermal oxidation (see FIG. 21).

Next, after the protective film 17 and the thermal oxide film 18 are removed (see FIG. 22), carbon ions are ion-implanted in a predetermined region or the entire main surface of the second main surface of the SiC epitaxial layer 12 (see FIG. 23). Then, after a surplus carbon region 31B having surplus interstitial carbon atoms is formed, the SiC epitaxial layer 12 is heated to form an activation layer 113C of the p-type (see FIG. 24).

Thus, in the process of thermal oxidation described above, in addition to the interstitial carbon atoms ejected into the SiC epitaxial layer 12 by forming the thermal oxide film 18, the surplus interstitial carbon atoms are introduced by the ion implantation. This can effectively reduce or remove the point defects in the SiC epitaxial layer 12 and close to (for example, within 500 nm from) the pn junction interface.

<Effects>

In this embodiment, the method for manufacturing a semiconductor device forms the protective film 17 at least on the surface of the ion implanted layer 13, forms the thermal oxide film 18 on the surface of the SiC epitaxial layer 12 and the back surface of the SiC epitaxial layer 12, and removes the protective film 17 and the thermal oxide film 18 after the SiC substrate 11 as a silicon carbide semiconductor substrate is removed and before the SiC epitaxial layer 12 as a drift layer is heated.

Then, forming the thermal oxide film 18 causes the interstitial carbon atoms to be ejected into the SiC epitaxial layer 12.

In addition to the interstitial carbon atoms ejected into the SiC epitaxial layer 12 by forming the thermal oxide film 18, the surplus interstitial carbon atoms are introduced by the ion implantation. Therefore, this configuration can effectively reduce or remove the point defects in the SiC epitaxial layer 12 and close to (for example, within 500 nm from) the pn junction interface.

The embodiments above takes the pn diode 20 as a semiconductor device as an example. When various SiC bipolar devices (such as IGBT, gate turn-off thyristor (GTO), and bipolar junction transistor (BJT)) having a pn junction except for the pn diode are manufactured, electrical characteristics of the device can be significantly improved by applying the method for manufacturing a semiconductor device of the present invention.

Although the materials of the respective components, the conditions of implementation (for example, crystal types of SiC, conductivity types of a semiconductor, and a specific thickness and a specific impurity concentration of each layer) and the like, are described in the embodiments of the present invention, the foregoing description is illustrative and not restrictive.

In addition, according to the present invention, the above embodiments can be arbitrarily combined, or each embodiment can be appropriately varied or omitted within the scope of the invention.

DESCRIPTION OF NUMERALS 10, 20 pn diode; 11 SiC substrate; 12 SiC epitaxial layer; 13 ion implanted layer; 14 electric field relaxation region; 15 anode electrode; 16 cathode electrode; 17 protective film; 18 thermal oxide film; 30 implantation mask; 31, 31A, 31B surplus carbon region; 113, 113A, 113B 113C activation layer.

The invention claimed is:

1. A bipolar semiconductor device having a breakdown voltage greater than or equal to 10 kV, comprising:
   a drift layer of a first conductivity type formed on a silicon carbide semiconductor substrate; and
   an activation layer of a second conductivity type formed in a predetermined region on a surface side of said drift layer,
   wherein a relationship among a carrier lifetime A in ns in a surface of said activation layer, a carrier lifetime B in ns in an interface between said activation layer and said drift layer, and a portion of said drift layer extending between said silicon carbide semiconductor substrate and said activation layer and having a thickness of T in μm satisfies $B \geq A \times 10$ and a value of $B \geq$ a value $0.3 \times T^2$.

2. The semiconductor device according to claim 1, wherein said first conductivity type is an n-type conductivity and said second conductivity time is a p-type conductivity.

* * * * *